(12) United States Patent
Martin et al.

(10) Patent No.: US 10,834,851 B2
(45) Date of Patent: Nov. 10, 2020

(54) WASHING MACHINE APPLIANCE HAVING A HEAT PIPE THEREIN

(71) Applicant: Haier US Appliance Solutions, Inc., Wilmington, DE (US)

(72) Inventors: Timothy Patrick Martin, Westerville, OH (US); Ramasamy Thiyagarajan, Louisville, KY (US); Troy Marshall Wright, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 324 days.

(21) Appl. No.: 16/120,495

(22) Filed: Sep. 4, 2018

(65) Prior Publication Data
US 2020/0077542 A1    Mar. 5, 2020

(51) Int. Cl.
*H05K 7/20* (2006.01)
*H05K 7/14* (2006.01)
*D06F 39/12* (2006.01)

(52) U.S. Cl.
CPC ......... *H05K 7/20336* (2013.01); *D06F 39/12* (2013.01); *H05K 7/1427* (2013.01); *H05K 7/2039* (2013.01)

(58) Field of Classification Search
CPC .................................................. H05K 7/20336
See application file for complete search history.

(56) References Cited

U.S. PATENT DOCUMENTS

| | | | |
|---|---|---|---|
| 5,982,616 A | 11/1999 | Moore | |
| 9,036,351 B2 | 5/2015 | Facusse | |
| 9,864,419 B2 | 1/2018 | Rhee et al. | |
| 2009/0038347 A1* | 2/2009 | Finch | D06F 33/00 68/12.02 |

FOREIGN PATENT DOCUMENTS

KR    20010011098 A    2/2001

* cited by examiner

*Primary Examiner* — Jason Y Ko
(74) *Attorney, Agent, or Firm* — Dority & Manning, P.A.

(57) ABSTRACT

A washing machine appliance is provided herein. The washing machine appliance may include a cabinet, a heat-generating electronic circuit board, and a heat pipe. The cabinet may extend in a transverse direction from a front end to a rear end. The cabinet may define an interior volume therein. The cabinet may include a metal back panel positioned at the rear end and defining at least a portion of the interior volume. The heat-generating electronic circuit board may be positioned within the interior volume. The heat pipe may extend in conductive thermal communication between the heat-generating electronic circuit board and the metal back panel.

20 Claims, 5 Drawing Sheets

WASHING MACHINE APPLIANCE HAVING A HEAT PIPE THEREIN

FIELD OF THE INVENTION

The present subject matter relates generally to washing machine appliances, and more particularly to washing machine appliances having one or more cooling assemblies for an electronic feature of a washing machine appliance.

BACKGROUND OF THE INVENTION

Washing machines or washing machine appliances are typically equipped to operate with one or more modes or cycles such as wash, rinse, and spin modes. During a wash or rinse mode for a vertical drive axis washing machine, the laundry articles are usually submerged at least partially within a wash or rinse fluid while an agitator is used to impart motion to the laundry articles that are contained within a wash basket. A wash tub contains the fluid, agitator, and wash basket. The agitator or wash basket may be driven, for instance, by a motor within a cabinet of the washing machine appliances.

Typical washing machine appliances include one or more electronic circuits, such as the control board, for operating more directing operations of the washing machine appliance (e.g., the motor). These electronic circuits are often housed within a cavity or cabinet of the washing machine appliance, such as in a backsplash positioned at an upper portion or rear portion of the cabinet. During use, heat may be generated from the electronic circuits. As is understood, excessive heat may eventually cause damage to the electronic circuits or adjacent components. Proper ventilation around the electronic circuits may be important for managing or dissipating heat. However, it may be difficult to ensure such ventilation, especially if the electronic circuit is housed within a relatively small or enclosed environment.

Therefore, there is a need for improved washing machine appliances. In particular, it would be advantageous to provide a washing machine appliance including one or more features for managing participating heat generated at or by an electronic circuit therein.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, a washing machine appliance is provided. The washing machine appliance may include a cabinet, a heat-generating electronic circuit board, and a heat pipe. The cabinet may extend in a transverse direction from a front end to a rear end. The cabinet may define an interior volume therein. The cabinet may include a metal back panel positioned at the rear end and defining at least a portion of the interior volume. The heat-generating electronic circuit board may be positioned within the interior volume. The heat pipe may extend in conductive thermal communication between the heat-generating electronic circuit board and the metal back panel.

In another exemplary aspect of the present disclosure, a washing machine appliance is provided. The washing machine appliance may include a cabinet, a heat-generating electronic circuit board, and a heat pipe. The cabinet may extend in a transverse direction from a front end to a rear end. The cabinet may define an interior volume therein. The cabinet may include a metal back panel positioned at the rear end and defining at least a portion of the interior volume. The heat-generating electronic circuit board may be positioned within the interior volume. The heat pipe may extend from a first end to a second end in conductive thermal communication between the heat-generating electronic circuit board and the metal back panel. The second end may be positioned above the first end along a vertical direction.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
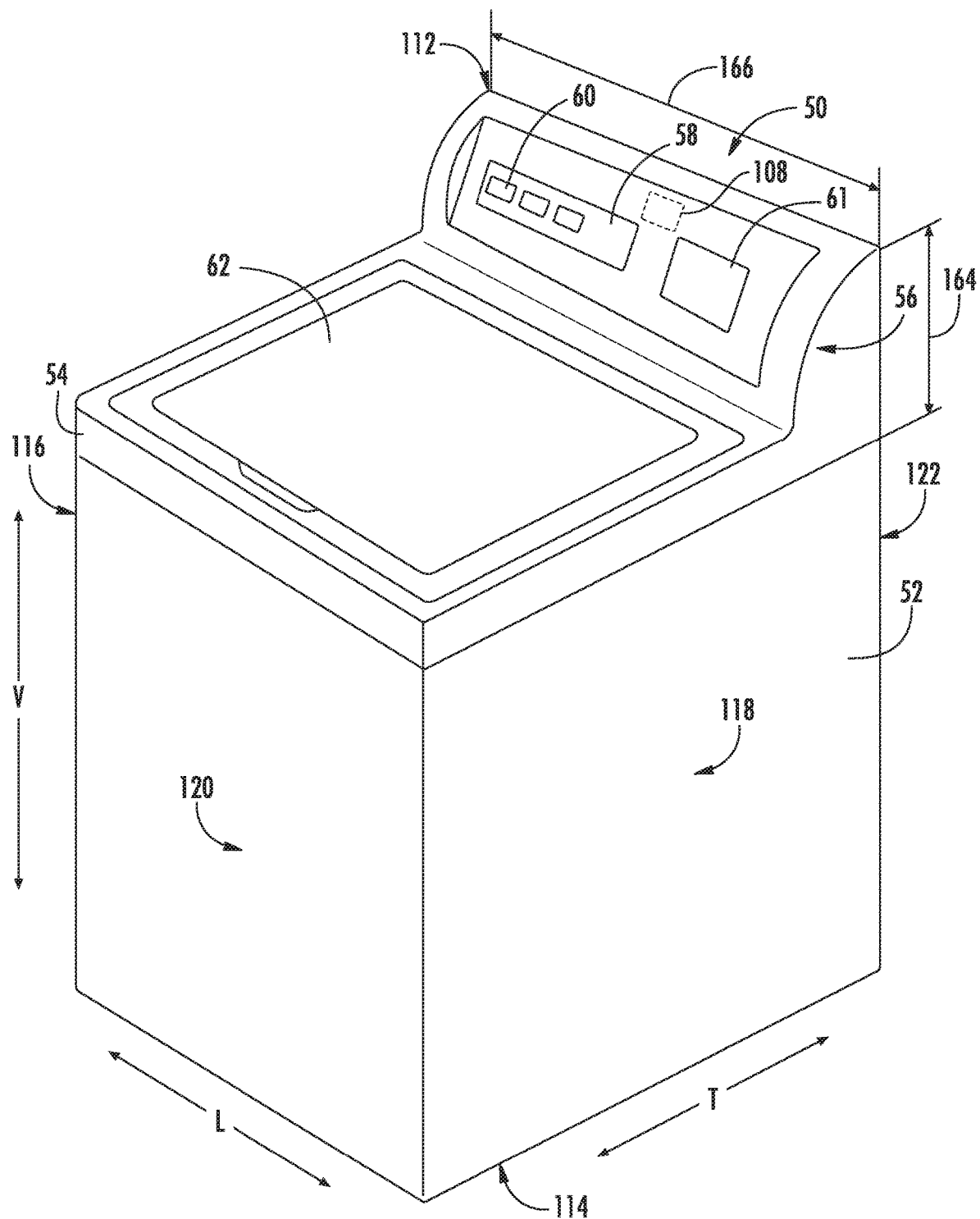
FIG. 1 provides a perspective view of a washing machine appliance according to exemplary embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "includes" and "including" are intended to be inclusive in a manner similar to the term "comprising." Similarly, the term "or" is generally intended to be inclusive (i.e., "A or B" is intended to mean "A or B or both"). The terms "first," "second," and "third" may be used interchangeably to distinguish one component from another and are not intended to signify location or importance of the individual components.

Figure 2:
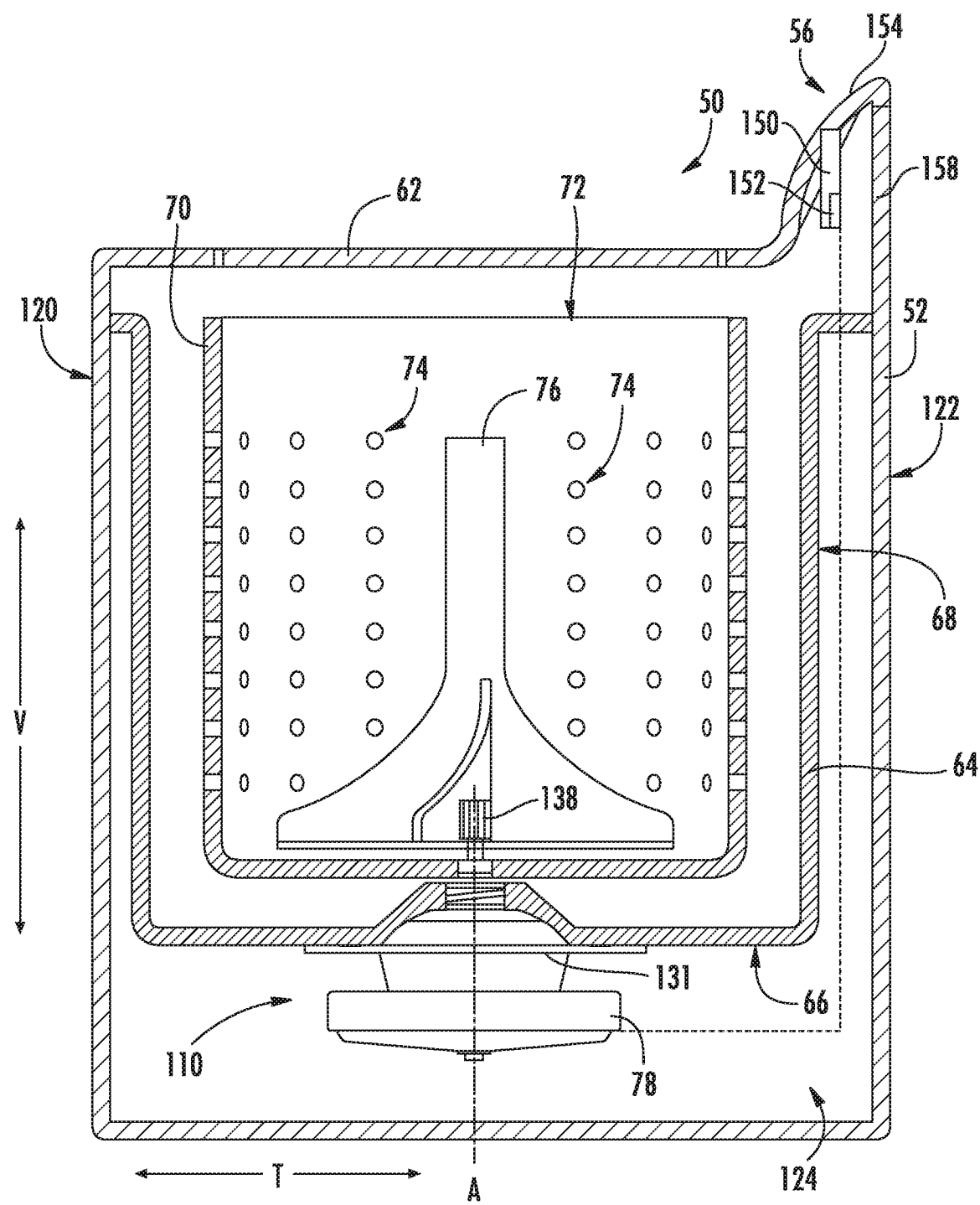
FIG. 2 provides a side cross-sectional view of the exemplary washing machine appliance of FIG. 1.

Turning now to the figures, FIG. 1 provides a perspective view of a washing machine appliance 50 according to exemplary embodiments of the present disclosure. FIG. 2 provides a side cross-sectional view of the exemplary washing machine appliance 50 of FIG. 1. As shown, washing machine 50 generally defines a mutually orthogonal vertical direction V, lateral direction L, and transverse direction T.

Washing machine appliance 50 includes a cabinet 52 that extends in or along the vertical direction V from a top end 112 to a bottom end 114; along the lateral direction L from a first side 116 to a second side 118; and in or along the transverse direction T from a front end 120 to a rear end 122. Within cabinet 52, an interior volume 124 may be defined.

In some embodiments, cabinet 52 includes a top cover 54 or a backsplash 56. For instance, backsplash 56 may extend from cover 54 (e.g., along or proximal to the rear end 122). A control panel 58 including a plurality of input selectors 60 may be coupled to backsplash 56. Control panel 58 and input selectors 60 may collectively form a user interface input for operator selection of machine cycles and features. In additional or alternative embodiments, a display 61 indicates selected features, a countdown timer, or other items of interest to machine users.

In certain embodiments, a door or lid 62 is mounted to cover 54 and is rotatable about a hinge (not shown) between an open position (not shown) facilitating access to wash tub 64 located within cabinet 52, and a closed position (shown in FIG. 1) forming an enclosure over wash tub 64. Wash tub 64 includes a bottom wall 66 and a sidewall 68. A basket 70 is rotatably mounted within wash tub 64. A pump assembly (not shown) is located beneath tub 64 and basket 70 for gravity assisted flow when draining tub 64.

As illustrated, wash basket 70 is movably disposed and rotatably mounted in wash tub 64 in a spaced apart relationship from tub sidewall 68 and the tub bottom 66. Basket 70 includes an opening 72 for receiving wash fluid and a wash load therein. Basket 70 includes a plurality of perforations 74 therein to facilitate fluid communication between an interior of basket 70 and wash tub 64.

In some embodiments, an agitation element or agitator 76 (e.g., a vane agitator, impeller, auger, or oscillatory basket mechanism, or some combination thereof) is disposed in basket 70 to impart an oscillatory motion to articles and liquid in basket 70. In different embodiments, agitator 76 includes a single action element (e.g., oscillatory only), double action (e.g., oscillatory movement at one end, single direction rotation at the other end), or triple action (e.g., oscillatory movement plus single direction rotation at one end, singe direction rotation at the other end). As illustrated in FIG. 2, agitator 76 and wash basket 70 are oriented to rotate about a drive axis A, which may be substantially parallel to vertical direction V.

In certain embodiments, basket 70 and agitator 76 are driven by a drive assembly 110, which may include a direct drive motor, such as permanent magnet synchronous motor 78 and shifter assembly, which operates to turn or rotate agitator 76 or basket 70 within tub 64. As illustrated, a current inverter board 152 may be provided within cabinet 52 (e.g., within backsplash 56). As an example, current inverter board 152 may be provided as part of an electronic circuit board 150. As another example, current inverter board 152 may be provided as a separate circuit board connected (e.g., through a harness) to a main circuit board or controller 108. In some embodiments, current inverter board 152 is electrically coupled to motor 78. During use, current inverter board 152 may transform or invert an alternating current to a direct current, and then to a three-phase alternating current, which may be then provided to motor 78 (e.g., to power operation of motor 78 and motivate rotation of basket 70 or agitator 76).

Operation of washing machine appliance 50 may be controlled by a controller or processing device 108. For instance, controller 108 may include all or a portion of electronic circuit board 150. Controller 108 may be connected (e.g., electrically coupled) to control panel 58 for user manipulation to select washing machine cycles and features. In response to user manipulation of control panel 58, controller 108 operates the various components of washing machine appliance 50 to execute selected machine cycles and features.

Controller 108 may include a memory (e.g., non-transitive media) and microprocessor, such as a general or special purpose microprocessor operable to execute programming instructions or micro-control code associated with a cleaning cycle. The memory may represent random access memory such as DRAM, or read only memory such as ROM or FLASH. In certain embodiments, the processor executes programming instructions stored in memory. The memory may be a separate component from the processor or may be included onboard within the processor. Alternatively, controller 108 may be constructed without using a microprocessor (e.g., using a combination of discrete analog or digital logic circuitry, such as switches, amplifiers, integrators, comparators, flip-flops, AND gates, and the like) to perform control functionality instead of relying upon software. Control panel 58 and other components of washing machine appliance 50, including drive assembly 110, may be in communication with controller 108 via one or more signal lines or shared communication busses.

In illustrative embodiments, laundry items are loaded into basket 70, and a washing operation is initiated through operator manipulation of control input selectors 60. Wash tub 64 is filled with water and mixed with detergent to form a wash fluid. The contents of basket 70 may be agitated with agitator 76 for cleansing of laundry items in basket 70. More specifically, agitator 76 may be moved back and forth in an oscillatory back and forth motion by drive assembly 110. In some embodiments, agitator 76 is rotated clockwise a specified amount about the drive axis A of the machine, and then rotated counterclockwise by a specified amount. The clockwise/counterclockwise reciprocating motion is sometimes referred to as a stroke, and the agitation phase of the wash cycle constitutes a number of strokes in sequence. Acceleration and deceleration of agitator 76 during the strokes imparts mechanical energy to articles in basket 70 for cleansing action. The strokes may be obtained in different embodiments with a reversing motor, a reversible clutch, or other known reciprocating mechanism.

After the agitation phase of the wash cycle is completed, tub 64 may be drained with the pump assembly. Laundry items may then be rinsed, and portions of the cycle repeated, including the agitation phase, depending on the particulars of the cleaning process selected by a user. In certain embodiments, basket 70 is held in a fixed position during portions of the wash and rinse cycles while agitator 76 is oscillated as described.

One or more spin cycles may also be used as part of the cleaning process. In particular, a spin cycle may be applied after the wash cycle or after the rinse cycle in order to wring wash fluid from the articles being washed. During a spin cycle, basket 70 may be rotated at relatively high speeds to help wring fluid from the laundry articles through holes 74.

Figure 3:
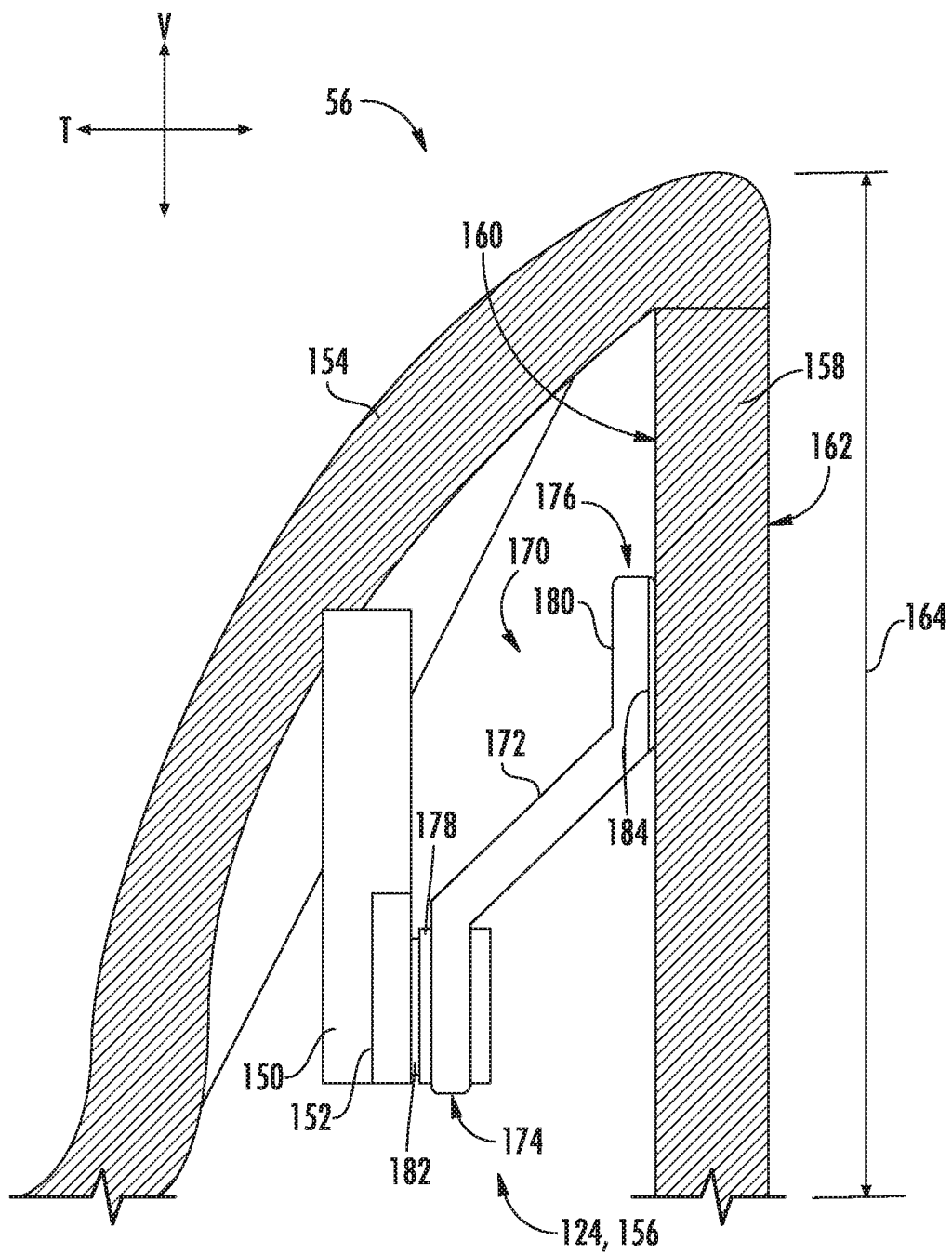
FIG. 3 provides a magnified, side, cross-sectional view of a portion of a washing machine appliance according to exemplary embodiments of the present disclosure.

Turning now to FIG. 3, FIG. 3 provides a magnified, side, cross-sectional view of a portion of a washing machine appliance 50 (FIG. 1) according to exemplary embodiments of the present disclosure. In particular, FIG. 3 provides a cross-sectional view of backsplash 56. As shown, backsplash 56 includes one or more enclosure walls 154 defining a portion of the interior volume 124. In particular, backsplash 56 defines a backsplash chamber 156 that may optionally be in fluid communication with the rest of interior volume 124 (or at least another portion thereof). Electronic circuit board 150 may be supported on a portion of the enclosure walls 154. A metal back panel 158 (e.g., formed from a suitable conductive metal, such as steel, aluminum, or one or more alloys thereof) may further enclose a backsplash chamber 156 with the enclosure walls 154. For example, metal back panel 158 may be positioned at the rear end 122 of cabinet 52 (FIG. 2) such that an interior surface 160 of metal back panel 158 faces interior volume 124 and an exterior surface 162 of metal back panel 158 is directed away from interior volume 124 (e.g., along with the rest of washing machine appliance 50). Optionally, metal back panel 158 may span substantially all of a vertical backsplash height 164 and substantially all of a backsplash width 166 (e.g., extending from first side 116 to second side 118 along the lateral direction L—FIG. 1). When assembled, metal back panel 158 may engage or otherwise be mated to enclosure walls 154.

Electronic circuit board 150 is understood to be a heat-generating member (i.e., electronic circuit board 150 generates heat during use) and is positioned, or otherwise mounted, within interior volume 124. As noted above, electronic circuit board 150 may include or be provided as a current inverter board 152. Heat at the current inverter board 152 may thus be generated as an alternating current is transformed to direct current and then back to three phases of alternating current. In certain embodiments, electronic circuit board 150 is mounted within backsplash chamber 156. For instance, one or more fastening mechanisms may join or otherwise attach electronic circuit board 150 to an enclosure wall 154.

Within interior volume 124 a cooling assembly 170 may be provided for dispersing or reducing heat at electronic circuit board 150 or current inverter board 152. In particular, one or more heat pipes 172 may extend between electronic circuit board 150 (or current inverter board 152) and metal back panel 158. In some embodiments, heat pipe 172 engages one or both of electronic circuit board 150 or metal back panel 158 in conductive thermal communication. In other words, heat may be conducted between the electronic circuit board 150 or metal back panel 158 to/from heat pipe 172. As is understood, heat pipe 172 may include any suitable structure, such as a conductive metal body defining one or more sealed voids housing a fluid refrigerant therein.

Figure 5:
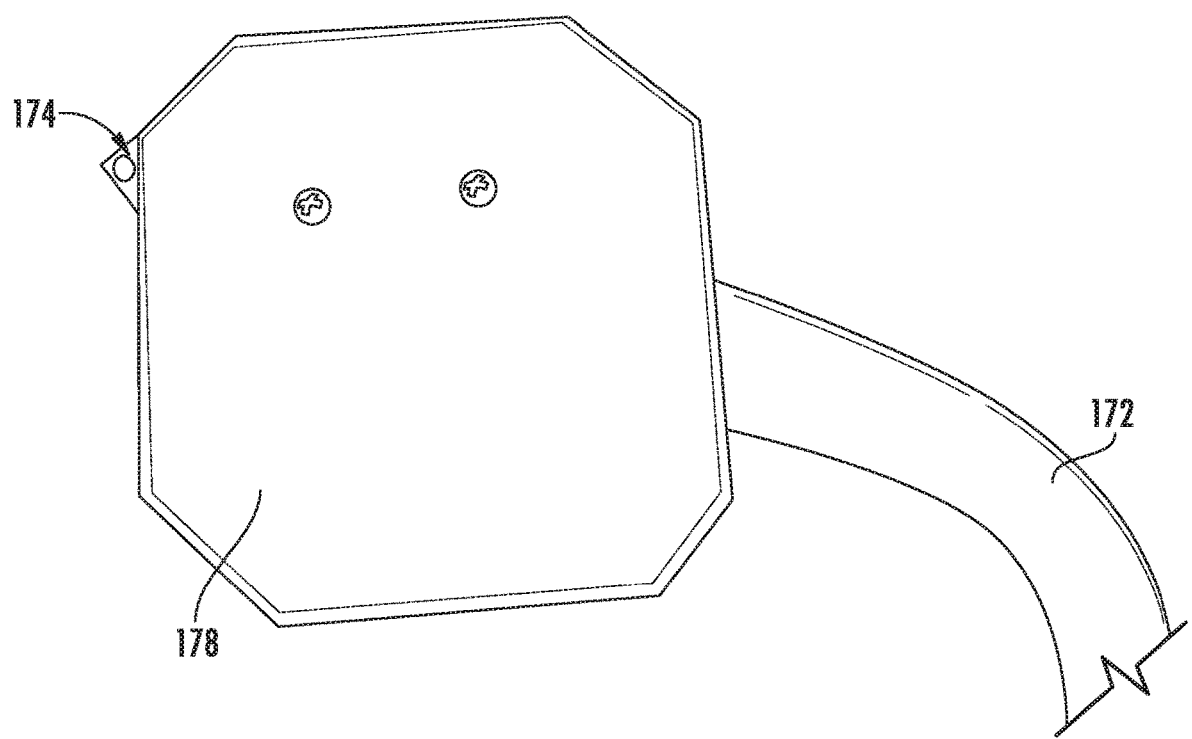
FIG. 5 provides a perspective view of a portion of a cooling assembly of a washing machine appliance according to exemplary embodiments of the present disclosure.

In certain embodiments, heat pipe 172 extends from a first end 174 to a second end 176. The first end 174 may be positioned at or on electronic circuit board 150 (e.g., at or on electronic circuit board 150 alone or, alternatively, at or on current inverter board 152). The second end 176 may be positioned at or on metal back panel 158. Optionally, an intermediate metal plate 178 (e.g., formed from a suitable conductive metal, such as steel, copper, aluminum, etc.) may be positioned between the electronic circuit board 150 and heat pipe 172 at the first end 174 (e.g., to provide an expanded surface area for contact between electronic circuit board 150 and heat pipe 172) (see also FIG. 5). In some such embodiments, intermediate metal plate 178 may be joined to first end 174 (e.g., via a suitable adhesive, weld, sinter, solder, etc.). Additionally or alternatively, a suitable thermal paste may be positioned between heat pipe 172 and electronic circuit board 150 or metal back panel 158. As an example, one portion of thermal paste 182 may hold intermediate metal plate 178 to electronic circuit board 150 at first end 174. As another example, another portion of thermal paste 184 may hold second end 176 to metal back panel 158 (e.g., at interior surface 160). Alternatively, a mechanical fastener or interference fit may hold second end 176 against metal back panel 158.

In exemplary embodiments, the first end 174 is positioned below the second end 176, as illustrated in FIG. 3. Heat pipe 172 may be positioned to extend in height (e.g., relative to the vertical direction) from the first end 174 to the second end 176. Optionally, heat pipe 172 may define an angled extension 180 (e.g., directed along the vertical direction V) at the second end 176. Angled extension 180 may contact and extend along a portion of metal back panel 158. In optional embodiments, angled extension 180 is held in contact with metal back panel 158 in a selective interference fit. For example, assembly of washing machine appliance 50 (FIG. 1) may cause the interior surface 160 of metal back panel 158 to press against heat pipe 172 (e.g., at angled extension 180) such that heat pipe 172 is deflected toward interior volume 124 or backsplash chamber 156. Separating metal back panel 158 from enclosure walls 154 may release heat pipe 172 from contact with interior surface 160 (e.g., such that heat pipe 172 is no longer positioned in an interference fit with metal back panel 158).

Figure 4:
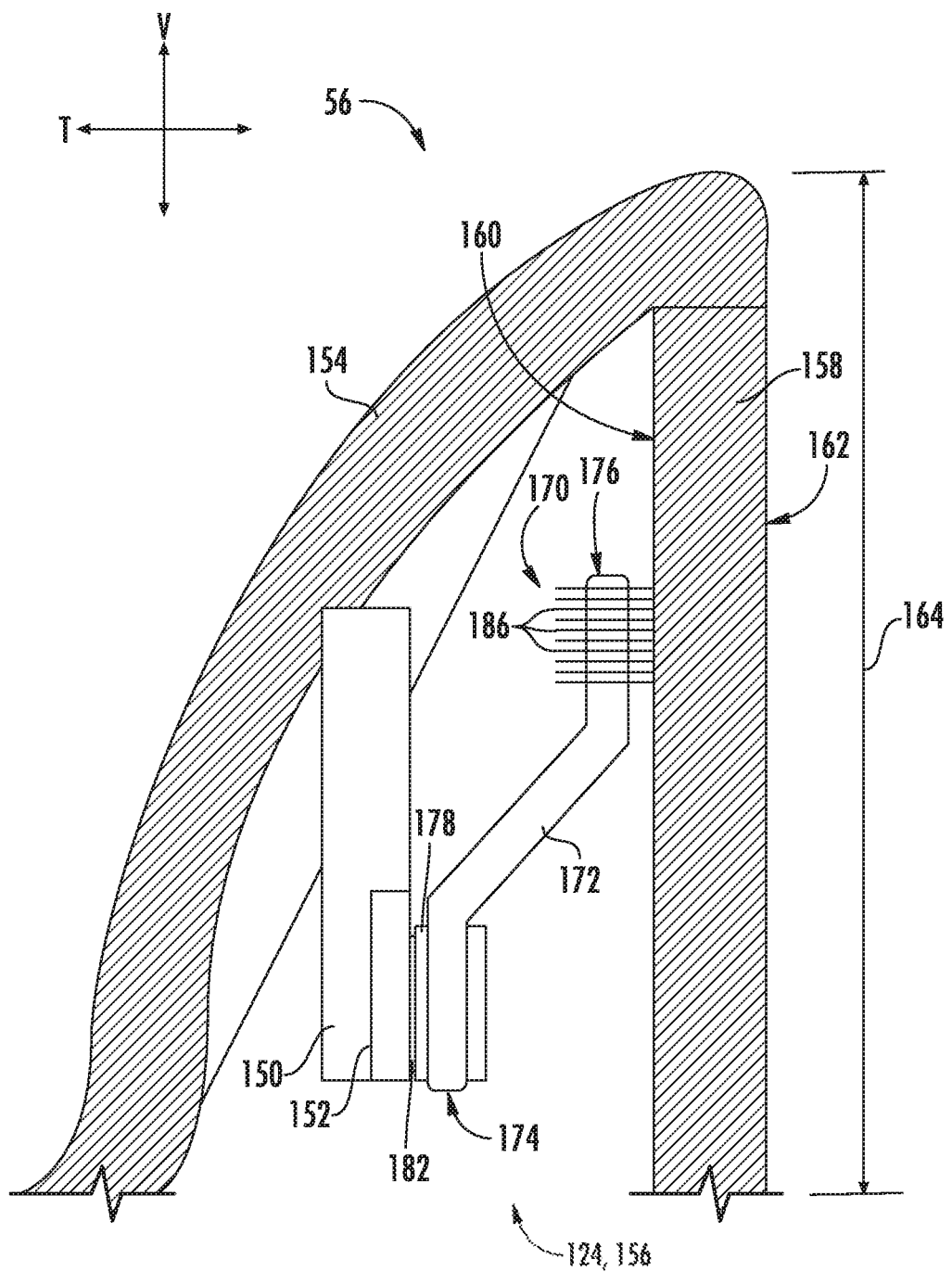
FIG. 4 provides a magnified, side, cross-sectional view of a portion of a washing machine appliance according to other exemplary embodiments of the present disclosure.

Turning now to FIG. 4, FIG. 4 provides a magnified, side, cross-sectional view of a portion of a washing machine appliance 50 (FIG. 1) according to other exemplary embodiments of the present disclosure. Except as otherwise described, it is understood that the exemplary embodiments illustrated in FIG. 4 are substantially similar or identical as the exemplary embodiments described above. For instance, in certain embodiments, heat pipe 172 includes a plurality of fins 186 extending outward at the second end 176. The fins 186 may be formed from any suitable conductive material (e.g., conductive metal, such as copper, steel, aluminum, etc.) joined to or integral with (e.g., as a unitary monolithic member with) an outer body or surface of heat pipe 172. The plurality of fins 186 may extend radially about the entirety of heat pipe 172 or merely a portion of heat pipe 172. One or more of the fins 186 may contact metal back panel 158 and, for example, conduct heat thereto (e.g., directly or through an intermediate conductive material, such as a thermal paste).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:
1. A washing machine appliance defining a mutually-orthogonal vertical direction, lateral direction, and transverse direction, the washing machine appliance comprising:
   a cabinet extending in the transverse direction from a front end to a rear end and defining an interior volume therein, the cabinet comprising a metal back panel positioned at the rear end and defining at least a portion of the interior volume;
   a heat-generating electronic circuit board positioned within the interior volume; and
   a heat pipe extending in conductive thermal communication between the heat-generating electronic circuit board and the metal back panel.

2. The washing machine appliance of claim 1, wherein the cabinet comprises a backsplash enclosing the heat-generating electronic circuit board.

3. The washing machine appliance of claim 1, further comprising an intermediate metal plate positioned between the heat-generating electronic circuit board and the heat pipe.

4. The washing machine appliance of claim 3, further comprising a thermal paste holding the intermediate metal plate to the heat-generating electronic circuit board.

5. The washing machine appliance of claim 1, wherein the heat-generating electronic circuit board comprises a current inverter board.

6. The washing machine appliance of claim 1, wherein the heat pipe comprises a first end positioned on the heat-generating electronic circuit board and a second end positioned on the metal back panel, and wherein the second end is positioned above the first end along the vertical direction.

7. The washing machine appliance of claim 6, further comprising a thermal paste holding the second end to the metal back panel.

8. The washing machine appliance of claim 6, wherein the heat pipe further comprises a plurality of fins extending radially outward at the second end.

9. The washing machine appliance of claim 1, wherein the heat pipe defines an angled extension at the second end, wherein the angled extension is held in contact with the metal back panel.

10. The washing machine appliance of claim 9, wherein the metal back panel forms a selective interference fit against the angled extension.

11. A washing machine appliance defining a mutually-orthogonal vertical direction, lateral direction, and transverse direction, the washing machine appliance comprising:
 a cabinet extending in the transverse direction from a front end to a rear end and defining an interior volume therein, the cabinet comprising a metal back panel positioned at the rear end and defining at least a portion of the interior volume;
 a heat-generating electronic circuit board positioned within the interior volume; and
 a heat pipe extending from a first end to a second end in conductive thermal communication between the heat-generating electronic circuit board and the metal back panel, wherein the second end is positioned above the first end along the vertical direction.

12. The washing machine appliance of claim 11, wherein the cabinet comprises a backsplash enclosing the heat-generating electronic circuit board.

13. The washing machine appliance of claim 11, further comprising an intermediate metal plate positioned between the heat-generating electronic circuit board and the heat pipe.

14. The washing machine appliance of claim 13, further comprising a thermal paste holding the intermediate metal plate to the heat-generating electronic circuit board.

15. The washing machine appliance of claim 11, wherein the heat-generating electronic circuit board comprises a current inverter board.

16. The washing machine appliance of claim 11, wherein the heat pipe comprises a first end positioned on the heat-generating electronic circuit board and a second end positioned on the metal back panel, and wherein the second end is positioned above the first end along the vertical direction.

17. The washing machine appliance of claim 16, further comprising a thermal paste holding the second end to the metal back panel.

18. The washing machine appliance of claim 16, wherein the heat pipe further comprises a plurality of fins extending radially outward at the second end.

19. The washing machine appliance of claim 11, wherein the heat pipe defines an angled extension at the second end, wherein the angled extension is held in contact with the metal back panel.

20. The washing machine appliance of claim 19, wherein the metal back panel forms a selective interference fit against the angled extension.

* * * * *